United States Patent
Yang

(10) Patent No.: US 7,815,446 B2
(45) Date of Patent: Oct. 19, 2010

(54) FLASH MEMORY DEVICE WITH RETRACTABLE PLUG

(75) Inventor: Jian-Bo Yang, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 266 days.

(21) Appl. No.: 12/218,739

(22) Filed: Jul. 16, 2008

(65) Prior Publication Data

US 2009/0021904 A1    Jan. 22, 2009

(30) Foreign Application Priority Data

Jul. 16, 2007    (CN) ............... 2007 2 0040751 U

(51) Int. Cl.
*H01R 13/44* (2006.01)
(52) U.S. Cl. ................. 439/131; 439/928.1
(58) Field of Classification Search ............ 439/76.1, 439/79, 131, 136, 139–142, 528, 928.1
See application file for complete search history.

(56) References Cited

U.S. PATENT DOCUMENTS

| 7,004,780 | B1 | 2/2006 | Wang |
| 7,172,460 | B2 * | 2/2007 | Zhao et al. ............ 439/607.56 |
| 7,661,967 | B2 * | 2/2010 | Tang et al. ................. 439/131 |
| 7,674,120 | B2 * | 3/2010 | Morganstern et al. ....... 439/131 |

* cited by examiner

*Primary Examiner*—Khiem Nguyen
(74) *Attorney, Agent, or Firm*—Wei Te Chung; Andrew C. Cheng; Ming Chieh Chang

(57) ABSTRACT

A flash memory device (100) includes a movable housing (1) defining a receiving cavity (15), a control board (2) having a circuit board (21) and a plug (22) connecting with the circuit board (21), an outer shield defining an opening (64), and a sleeve (3) movably ringed on one side of the movable housing (1) and enclosing the plug (22). The circuit board (21) is retained in the receiving cavity (15). The plug (22) extends out of the receiving cavity (15). The movable housing (1) is movably mounted in the outer shield. The movable housing (1) has an elastic section (141) with a button (18) coupled thereon. The button (18) pushes the plug (22) moving in or out of the sleeve (3) and the outer shield.

8 Claims, 10 Drawing Sheets

FLASH MEMORY DEVICE WITH RETRACTABLE PLUG

BACKGROUND OF THE INVENTION

1. Field of the Invention

The present invention relates to a flash memory device, and more particularly to a flash memory device with a retractable plug.

2. Description of Related Art

A flash memory device is widely used by consumers as an intermedium for accessing data files from one device to another, or like a portable hard drive for installing materials.

Usually, a flash memory device includes a circuit board with a plurality of electronic components, such as driver chip, memory chip, oscillator, resistor, etc. for saving and loading data, functioning as a miniature hard drive or wireless communication/transmission, a plug connected to one end of the circuit board, and a metal shield enclosing the circuit board. The plug extends out of the metal shield for connecting with various peripherals. The plug usually is a Universal Serial Bus (USB) plug. The USB plug is usually housed and protected from dust by a detachable cap.

However, when a flash memory device is connected with a peripherals, such as a computer, its detached cap may be left unnoticed near the computer and lost due to its small size. Once the extra cap is lost, the USB plug cannot be easily shielded from dust.

It is not only flash memory device having above problem, but also other electronic devices with a plug exposed to the air, such as a Wireless Lan Card, Wireless Signal Receiver, etc, facing above problem.

Hence, it is desired to overcome the drawbacks of the conventional flash memory device in terms of improvement.

BRIEF SUMMARY OF THE INVENTION

According to one aspect of the present invention, a flash memory device comprises a movable housing defining a receiving cavity, a control board having a circuit board and a plug connecting with the circuit board, an outer shield defining an opening at one end thereof, and a sleeve movably ringed on one side of the movable housing and enclosing the plug. The circuit board is retained in the receiving cavity. The plug extends out of the receiving cavity. The movable housing is movably mounted in the outer shield. The movable housing has an elastic section with a button coupled thereon. The button pushes the plug to move in or out of the sleeve and the outer shield.

According to another aspect of the present invention, a flash memory device comprises a movable housing defining a receiving cavity, a control board having a circuit board and a plug connecting with the circuit board, an outer shield defining an opening at one end thereof, and a sleeve movably ringed on one side of the movable housing and enclosing the plug. The circuit board is retained in the receiving cavity. The plug extends out of the receiving cavity. The movable housing has an elastic section. The elastic section has a button extending out of the outer shield. The button can push the movable housing moving relative to the outer shield. The sleeve is moved out of the opening firstly when pushing the button forwardly. The plug is moved out of the sleeve secondly as the sleeve moving out of the opening.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENT

Figure 1:
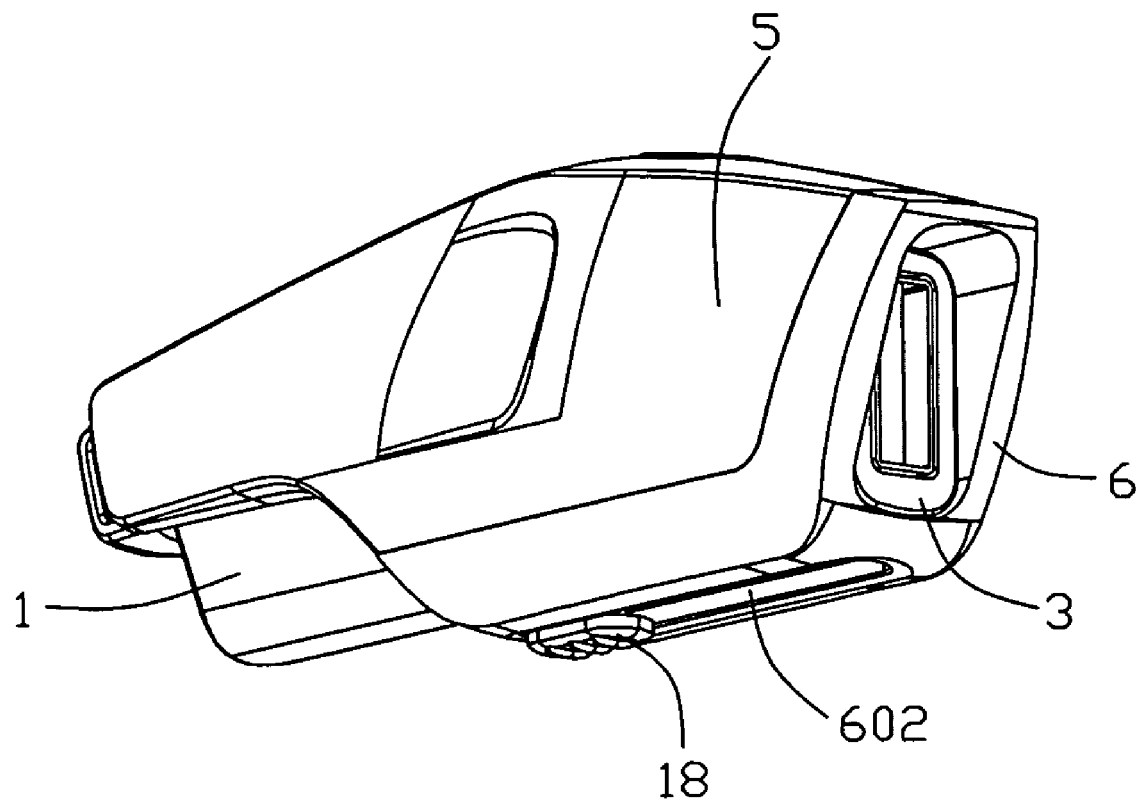
FIG. 1 is a perspective view of the preferred embodiment of a flash memory device according to the present invention.
Figure 2:
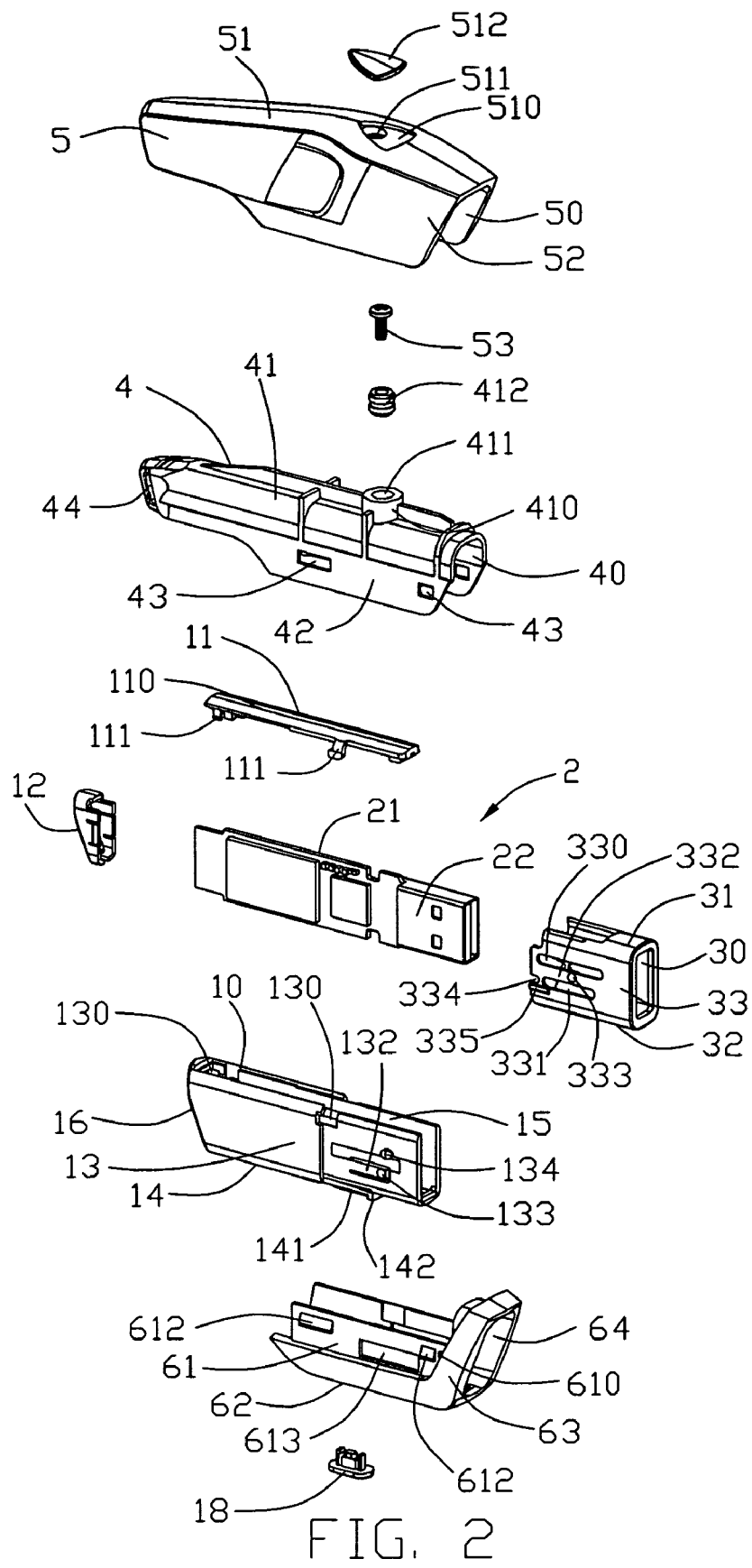
FIG. 2 is an exploded perspective view of the flash memory device shown in FIG. 1.
Figure 3A:
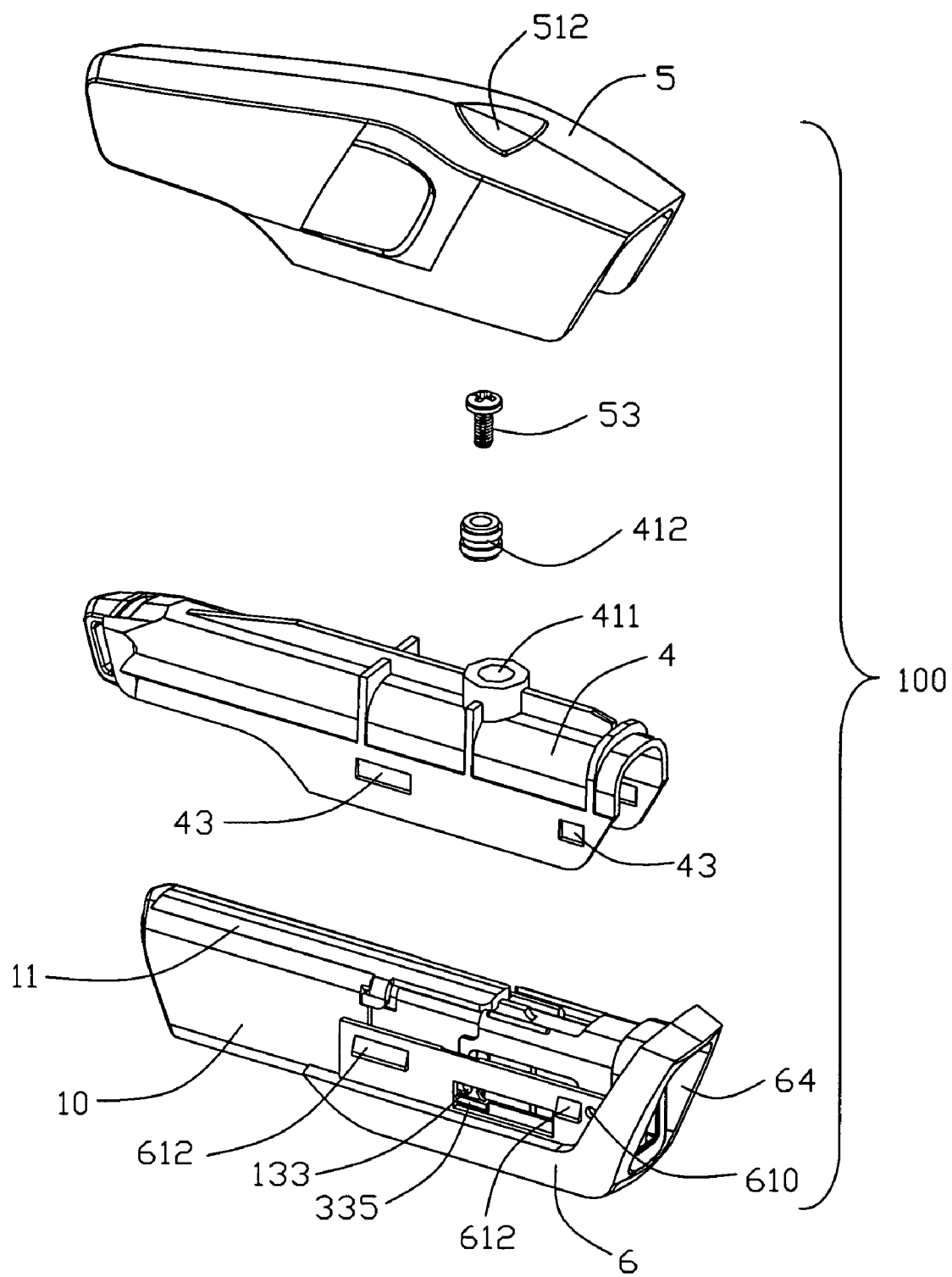
FIGS. 3A and 3B are partial exploded perspective and partial perspective view showing a plug received in a sleeve and an outer shield of the flash memory device.
Figure 3B:
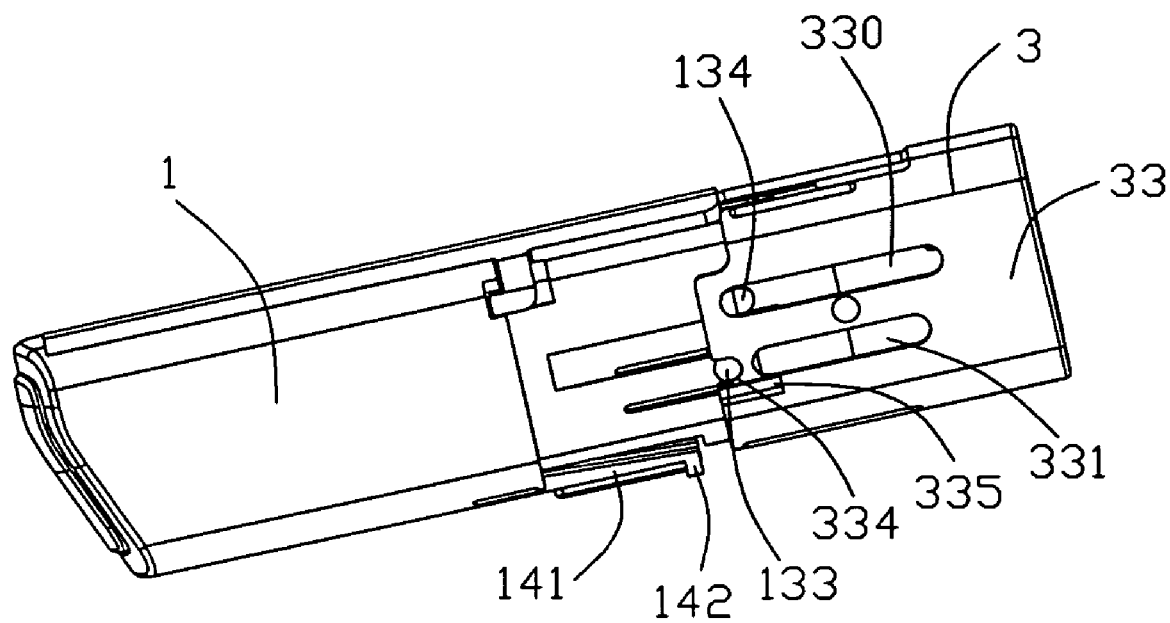
Figure 4:
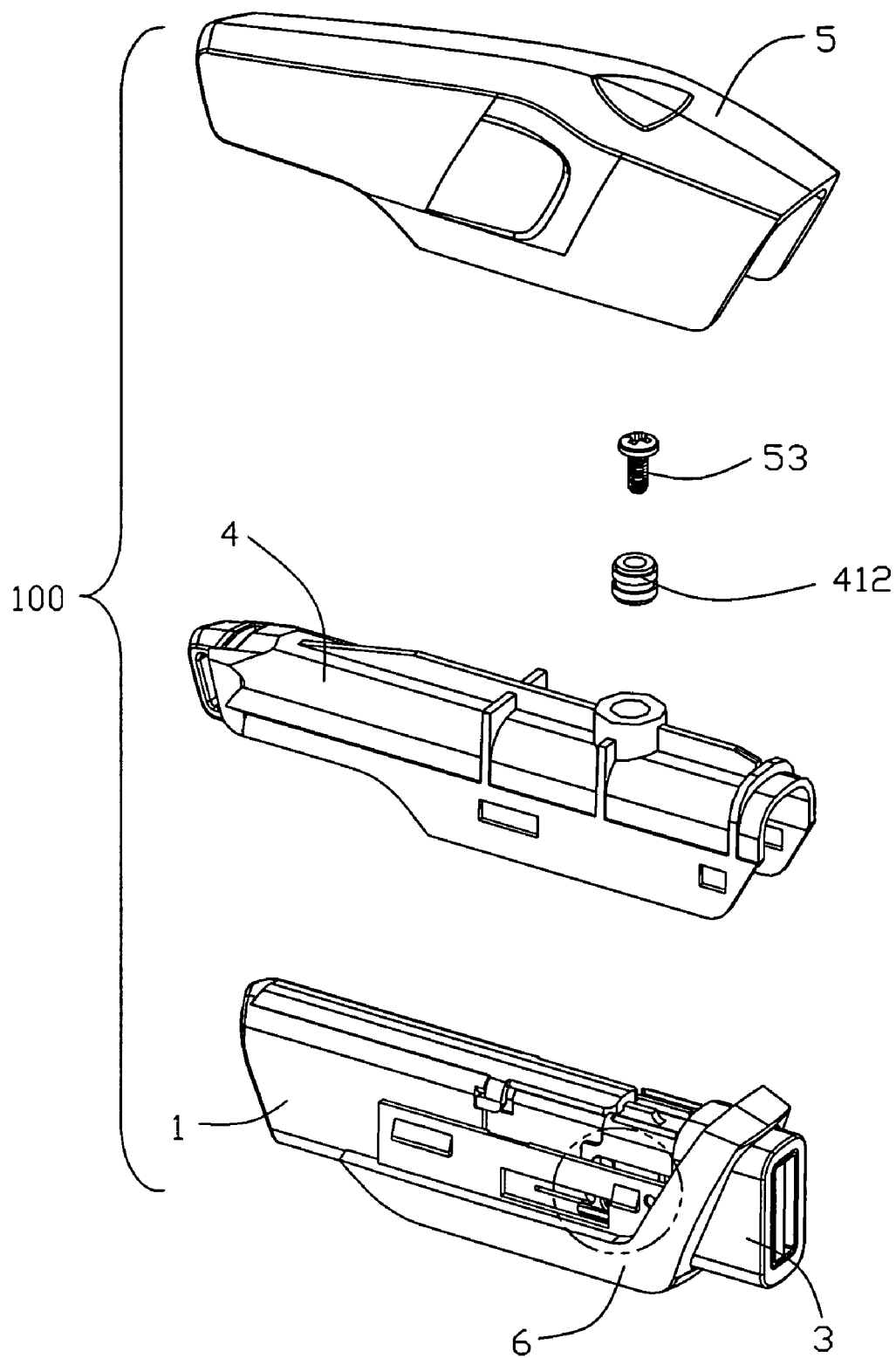
FIG. 4 is a partial exploded perspective view of the flash memory device, which showing the sleeve extending out of the outer shield.
Figure 5:
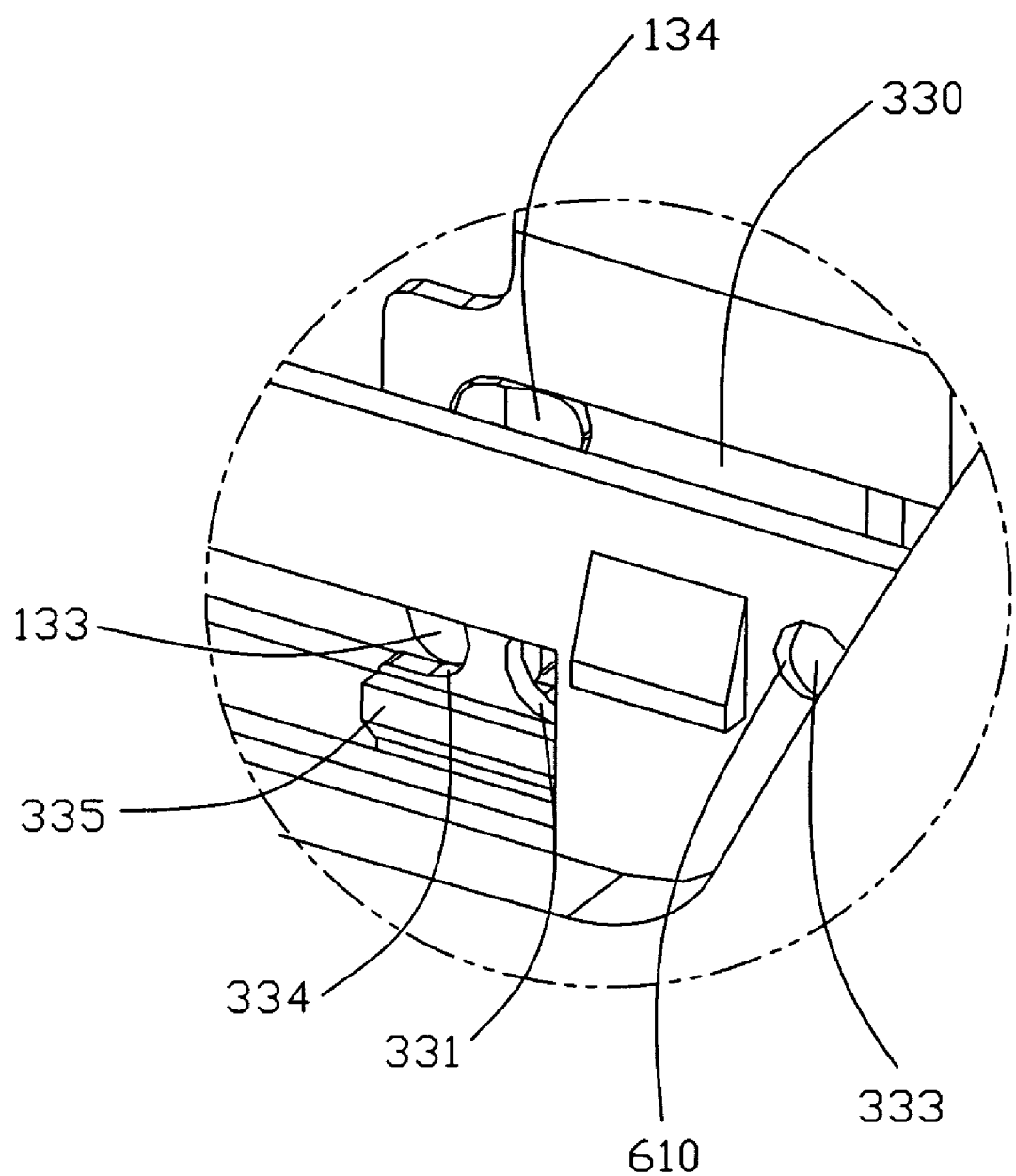
FIG. 5 is a partial magnified view of the FIG. 4, which showing the sleeve engaging with the outer shield.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Referring to FIGS. 1-8, a flash memory device 100 is disclosed in accordance with the present invention. The flash memory device 100 comprises a movable housing 1, a control board 2 retained in the movable housing 1, a sleeve 3 mounted on a front end of the movable housing 1 and an outer shield enclosing the movable housing 1.

The movable housing 1 comprises a body portion 10, a top cover 11 fixed on a top side of the body portion 10, and a rear cover 12 covering a rear end of the body portion 10. The body portion 10 comprises a pair of side walls 13 and a lower wall 14 connected two side walls 13. The side walls 13 and the lower wall 14 define a receiving cavity 15. The body portion 10 defines a fastening hole 16 engaging with the rear cover 12 for preventing the receiving cavity 15 from dust.

The side walls 13 define a plurality of recesses 130 on the top side thereof. The top cover 11 comprises a smooth top wall 110, and a plurality of locking barbs 111 engaging with the recesses 130 for fixing the top cover 11 on the body portion 10. Each side wall 13 has a spring arm 132 which can move inwardly. The spring arm 132 has an emboss 133 extending outwardly. The side wall 13 comprises a post 134 extending outwardly at a front position thereof. The lower wall 14 is formed with an elastic section 141 which can be deflected along an up to down direction. The elastic section 141 has a projection 142 extending outwardly at a free end thereof and a hollow 143 behind the projection 142. In addition, the flash memory device 100 comprises a button 18 fastened in the hollow 143 of the elastic section 141 for pressing the elastic section 141 downwardly and forwardly.

The control board 2 includes a circuit board 21 and a plug 22 connecting with the circuit board 21. The circuit board 21 comprises a plurality of electronic components (not shown), such as driver chip, memory chip, oscillator, resistor, etc. for saving and loading data, functioning as a miniature hard drive or wireless communication/transmission. The plug 22 is a Universal Serial Bus (USB) plug in the present invention for connecting with various peripherals (not shown). But it is not limited to a USB plug.

The sleeve 3 comprises an upper wall 31, a lower wall 32, and a pair of side walls 33. The upper wall 31, lower wall 32 and side walls 33 define a first receiving space 30 for receiving the plug 22. Each side wall 33 defines a first slot 330 and a second slot 331 parallel to each other. The first and second slots 330, 331 extend along a front to back direction. The post 134 of the movable housing 1 is movably received in the first slot 330. The emboss 133 of the spring arm 132 can be moving in the second slot 331. The side wall 33 comprises an elastic portion 332 between the first slot 330 and the second slot 331. The elastic portion 332 comprises a protrusion 333 which can be pressed inwardly. The side wall 33 also defines a cutout 334 at a rear end thereof. The cutout 334 is adjacent to the second slot 331. The emboss 134 abuts against the inside of the cutout 334 for pushing the sleeve 3 moving forwardly. A rib 335 extends outwardly from a lower side of the side wall 33.

The outer shield comprises a case 4, an upper shield 5 enclosing the case 4, and a lower shield 6 engaging with the case 4. The case 4 comprises a pair of side walls 42 and a top wall 41. The side walls 42 and the top wall 41 define a second receiving space 40. The top wall 41 has a cylinder 410. The cylinder 410 defines a through hole 411 for receiving a nut 412 therein. Each side wall 41 defines a plurality of apertures 43 communicating with the second receiving space 40. The case 4 defines a mounting hole 44 for fastening a rope (not shown).

The upper shield 5 has a pair of side walls 52 affixed to the side walls 42 of the case 4, and a top wall 51 affixed to the top wall 41 of the case 4. The side walls 52 and top wall 51 define a third receiving space 50 for receiving the case 4 therein. The top wall 51 defines a depression 510 which is substantially of a triangle shape, and a fastening hole 511 communicating with the depression 510 and the hole 411 of the case 4. A bolt 53 is assembled in the fastening hole 511 and the through hole 411 for fastening the upper shield 5 and the case 4 together. A cap 512 is received in the depression 510 for covering the bolt 53.

The lower shield 6 comprises a pair of side walls 61 and a lower wall 62. The side walls 61 and the lower wall 62 define a fourth receiving space 60. The lower shield 6 has a ring portion 63 located at a front end thereof. The ring portion 63 defines an opening 64 communicating with the fourth receiving space 60. The plug 22 and the sleeve 3 can move through the opening 64 and out of the lower shield 6 for connecting with a peripheral. The side walls 61 have a plurality of tubers 612 engaging with the openings 43 of the case 4 for fastening them together. Each side walls 61 defines an elongate indentation 613 and a locking hole 610. The rib 335 moves in the elongate indentation 613 along the front to back direction. The protrusion 333 is received in the locking hole 610 when the sleeve 3 moves out of the opening 64 of the lower shield 6. The lower wall 62 defines a third slot 602 extending along the front to back direction, and two locking notches 601 located at a front and rear position of the third slot 602 respectively. The button 18 moves in the third slot 602 for guiding the plug 22 and the sleeve 3 through the opening 64. When the plug 22 and the sleeve 3 is received in the outer shield, the projection 142 is locked in the locking notch 601 located at the rear position. When the plug 22 moves out of the outer shield, the projection 142 is locked in the locking notch 601 located at the front position for preventing the plug 22 from moving backwardly.

Referring to FIGS. 1-3B, in assembly, firstly, installing the control board 2 into the receiving cavity 15 of the movable housing 1, the plug 22 extends out of the receiving cavity 15. Secondly, ringing the sleeve 3 on the front end of the movable housing 1, the plug 22 is received in the first receiving space 30. The post 134 of the movable housing 1 is movably received in a rear end of the first slot 330. The emboss 133 of the movable housing 1 is received in the cutout 334 of the sleeve 3. Thirdly, assembling the movable housing 1 into the fourth receiving space 60 of the lower shield 6, and mounting the button 18 in the hollow 143, the rib 335 is located in a rear end of the indention 613. The projection 142 is received in the locking notch 601 of the rear position. The front end of the plug 22 and the sleeve 3 is located in the opening 64. Fourthly, mounting the case 4 on the lower shield 6, the tubers 612 of the lower shield 6 is locked in the openings 43 of the case 4. Finally, fixing the nut 412, bolt 53, upper shield 5 and the cover 512 onto the case 4, the bolt 53 engages with the nut 412 for fixing the upper shield 5 and the case 4 together. The flash memory device 100 of the present invention is assembled well.

Figure 6A:
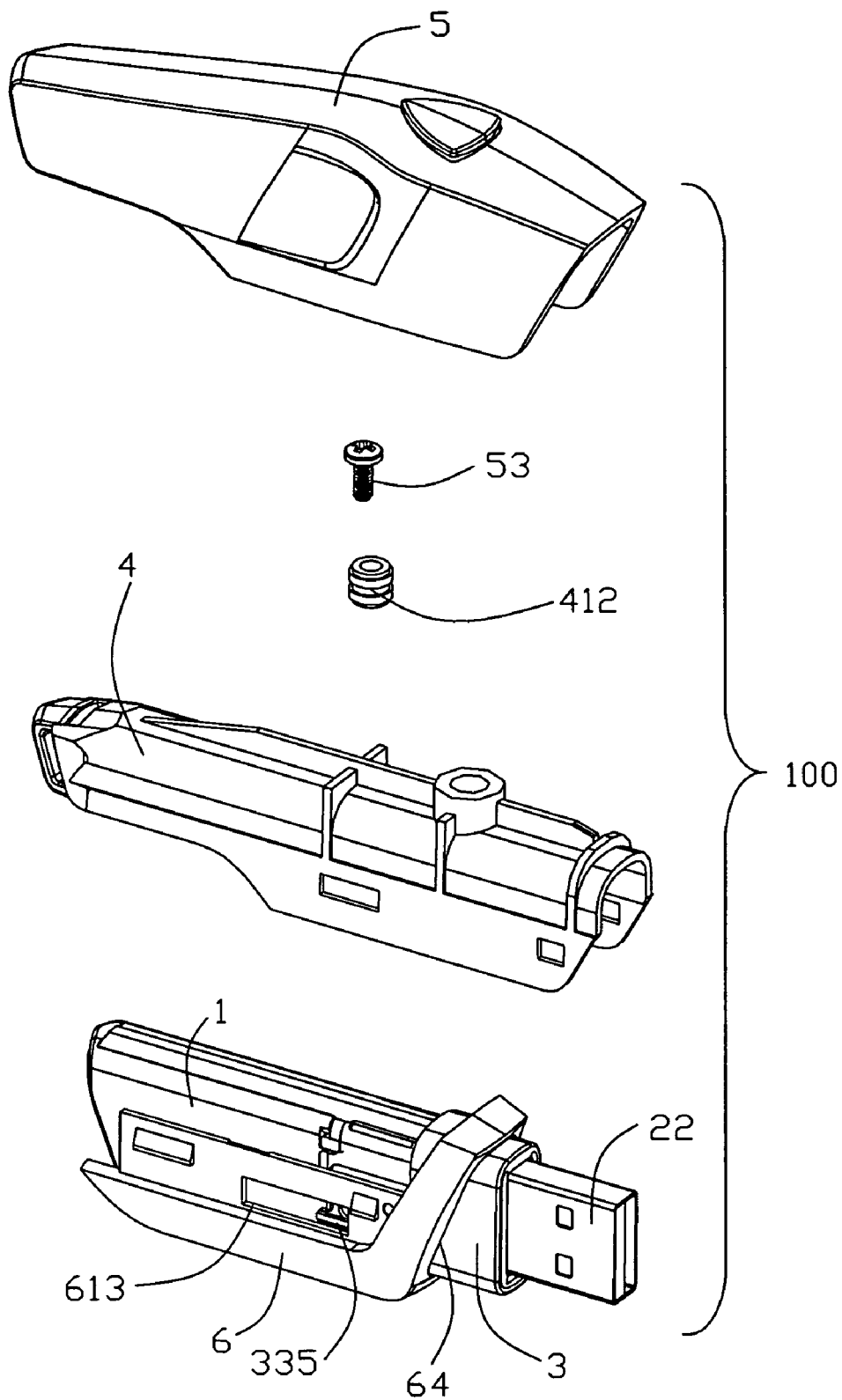
FIGS. 6A and 6B are partial exploded perspective and partial perspective view showing the plug extending out of the sleeve.
Figure 6B:
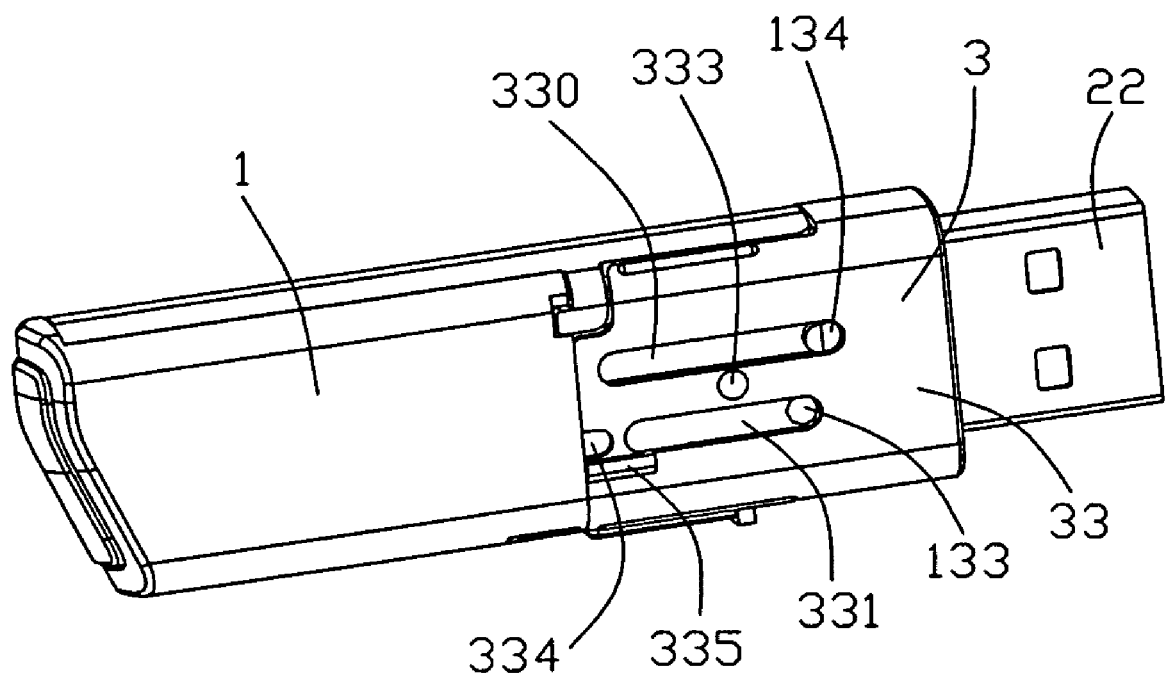
Figure 7:
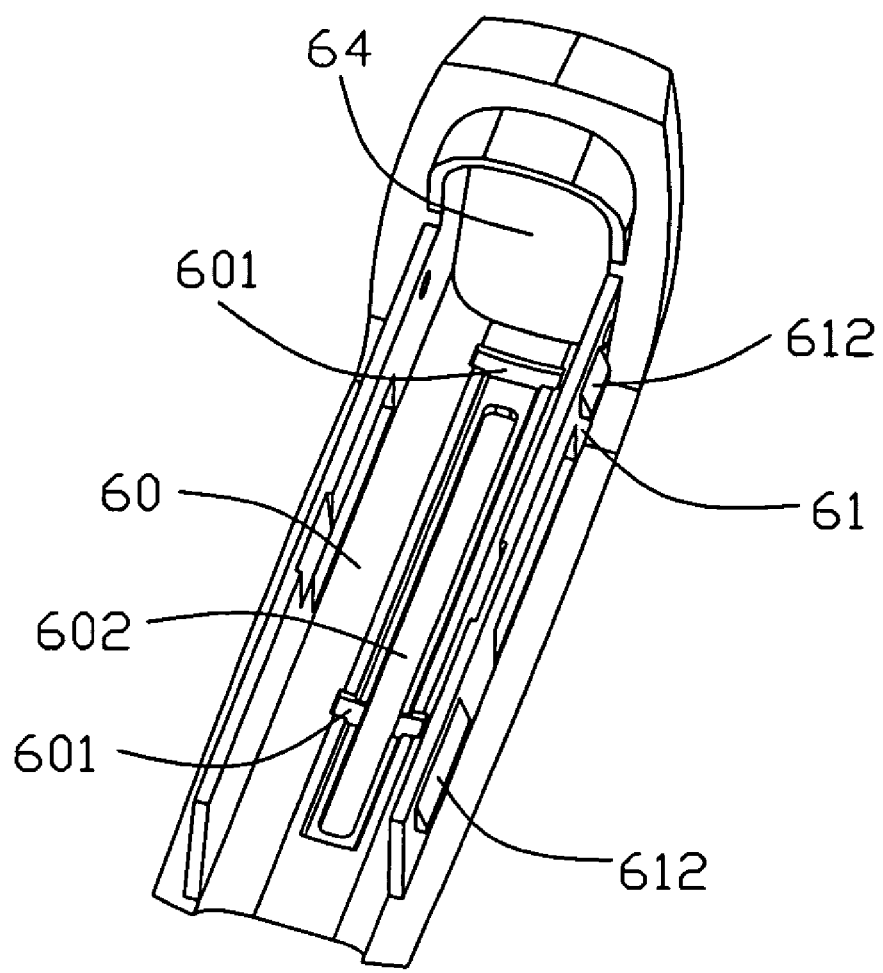
FIG. 7 is a perspective view of a lower shield of the flash memory device.
Figure 8:
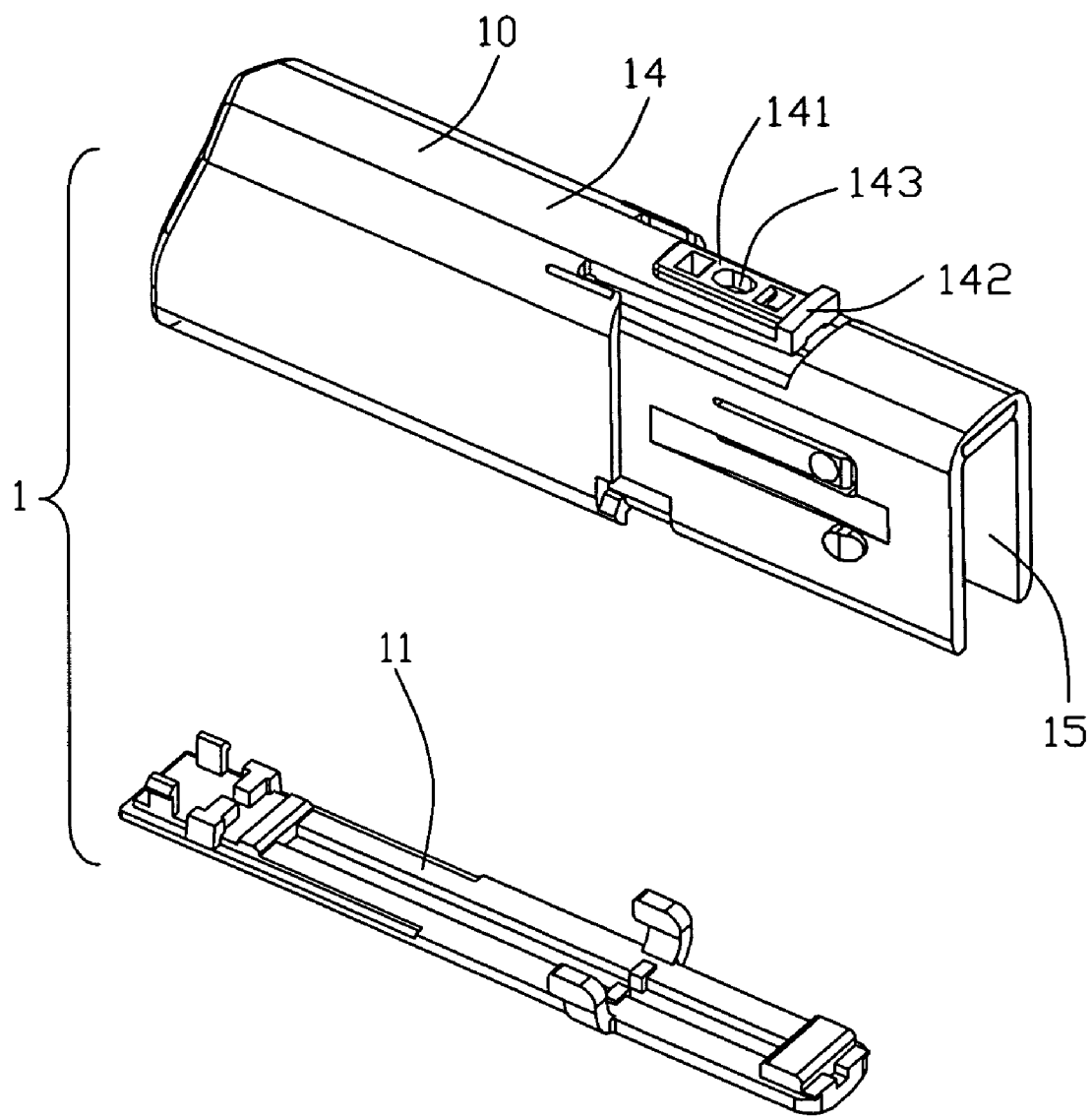
FIG. 8 is an exploded perspective view of a movable housing of the flash memory device.

Referring to FIGS. 4-6B, when pressing and pushing the button 18, the projection 142 moves out of the notch 601 of the rear position. The emboss 133 is received in the cutout 334. The button 18 drives the plug 22 and the sleeve 3 moving forwardly. As the sleeve 3 moves out of the opening 64, the rib 335 abuts against the front end of the indention 613. The protrusion 333 is locked in the locking hole 610 for preventing the sleeve 3 moving forwardly or backwardly. Then pushing the button 18 unceasingly, the emboss 133 jumps into the second slot 331 and moves forwardly, the plug 22 moving out of the first receiving space 30 of the sleeve 3. Finally, the projection 142 is locked in the notch 601 of the front position for preventing the plug 22 from moving forwardly or backwardly. As shown in FIG. 6B, then the emboss 133 abuts against a front end of the second slot 331, the post 134 abutting against a front end of the first slot 330. At this time, the plug 22 can be electrically connected with a peripheral. In the process of pushing the button 18, the plug 22 is surrounded by the sleeve 3, therefore, the plug 22 can be protected from destroying.

When the plug 22 is not used, the plug 22 can be retracted in the outer shield by pushing the button 18 backwardly. Then the plug is protected from dust by the outer shield.

With contrast to a normal flash memory device, the plug 22 of the flash memory device 100 is retractable in or out of the outer shield. The plug 22 can be protected by the outer shield. Therefore, the flash memory device 100 does not need a detachable cap for protecting the plug 22 from dust. It is convenient to application and take.

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A flash memory device, comprising: a movable housing defining a receiving cavity; a control board having a circuit board and a plug connecting with the circuit board, the circuit board retained in the receiving cavity, the plug extending out of the receiving cavity; an outer shield defining an opening at one end thereof; and a sleeve movably ringed on one end of the movable housing and enclosing the plug; wherein the movable housing is movably mounted in the outer shield, and the movable housing has an elastic section with a button coupled thereon, wherein the button pushes the plug to move in or out of the sleeve and the outer shield, wherein the outer shield defines an indention, and the sleeve comprises a rib movably received in the indention, wherein the sleeve defines a first slot, and the movable housing defines a post which can move in the first slot, wherein the sleeve defines a second slot and a cutout adjacent to the second slot, and the movable housing defines a spring arm with an emboss thereon, wherein the emboss engages with the cutout for driving the sleeve moving forwardly relative to the outer shield, when the sleeve moves out of the opening, the emboss jumps into the second slot and drives the plug moving out of the sleeve, wherein the sleeve comprises an elastic portion between the first slot and the second slot, and the elastic portion has a protrusion extending outwardly therefrom, the outer shield defines a locking hole engaging with the protrusion when the sleeve moves out of the opening.

2. The flash memory device according to claim 1, wherein the movable housing comprises a lower wall, and the elastic section extends from the lower wall, the elastic section comprises a projection extending outwardly, the button is located adjacent to the projection.

3. The flash memory device according to claim 2, wherein the outer shield defines two locking notches and a third slot, wherein the button moves in the third slot for driving the plug in or out of the outer shield, the projection engages with the locking notches for positioning the plug in or out of the outer shield.

4. The flash memory device according to claim 1, wherein the outer shield comprises a case, an upper shield and a lower shield, wherein the case defines a plurality of apertures, the lower shield comprises a plurality of tubers engaging with the apertures, the upper shield covers the outer side of the case.

5. A flash memory device, comprising: a movable housing defining a receiving cavity; a control board having a circuit board and a plug connecting with the circuit board, the circuit board retained in the receiving cavity, the plug extending out of the receiving cavity; an outer shield defining an opening at one end thereof; and a sleeve movably ringed on one side of the movable housing and enclosing the plug; wherein the movable housing is movably received in the outer shield, the movable housing having an elastic section, the elastic section comprises a button extending out of the outer shield which can push the movable housing moving relative to the outer shield; wherein the sleeve is moved out of the opening firstly when pushing the button forwardly, the plug is moved out of the sleeve secondly as the sleeve moving out of the opening, wherein the outer shield defines an indention, and the sleeve comprises a rib movably received in the indention, wherein the sleeve defines a first slot, and the movable housing defines a post moving in the first slot, wherein the sleeve defines a second slot and a cutout adjacent to the second slot, and the movable housing defines a spring arm with an emboss thereon, wherein the emboss engages with the cutout for driving the sleeve moving forwardly relative to the outer shield, when the sleeve moves out of the opening, the emboss jumps into the second slot and drives the plug moving out of the sleeve, wherein the sleeve comprises an elastic portion between the first slot and the second slot, and wherein the elastic portion has a protrusion extending outwardly therefrom, the outer shield defines a locking hole engaging with the protrusion when the sleeve moves out of the opening.

6. The flash memory device according to claim 5, wherein the movable housing comprises a lower wall, the elastic section extends from the lower wall, the elastic section comprises a projection extending outwardly, the button is located adjacent to the projection.

7. The flash memory device according to claim 6, wherein the outer shield defines two locking notches and a third slot, wherein the button moves in the third slot for driving the plug in or out of the outer shield, the projection engages with the locking notches for positioning the plug in or out of the outer shield.

8. A flash memory device comprising: an outer shield defining an opening at a front end; a housing enclosed in the outer shield and being moveable relative to the outer shield in a front-to-back direction; a connector retained to a front end of the housing; and a sleeve located around the opening and moveable relative to the shield in said front-to-back direction, said sleeve essentially surrounding the connector and being surrounded by the shield; wherein the sleeve is moveable relative to the shield along said front-to-back direction with a first distance, the housing is moveable relative to the sleeve along said front-to-back direction with a second distance, and the housing is moveable relative to the shield along said front-to-back direction with a third distance under a condition that the third distance is essentially equal to a sum of said first distance and said second distance, wherein a first slot/protrusion structure is provided between the sleeve and the shield to perform relative movement of said first distance, a second slot/protrusion structure is provided between the housing and the sleeve to perform relative movement of said second distance, and a third slot/protrusion structure is provided between the housing and the shield to perform the relative movement of said third distance, wherein the sleeve defines an outmost position relative to the shield, and the connector defines an outmost position relative to the shield under a condition that the outmost position of the connector is farther than the outmost position of the sleeve, further including a locking device to lock the housing in position relative to the shield when said housing is located at an innermost position and said outermost position, wherein complementary interengagement devices are formed one the housing, the sleeve and the shield so as to have the sleeve reach the corresponding outermost position before the connector reaches the corresponding outermost position during ejecting the connector out of the opening while also have the sleeve leave the corresponding outermost position after the connector leaves the corresponding outermost position so as to have a reciprocal operation in sequence during ejection/retraction of the connector with regard to the shield.

* * * * *